US012422900B2

(12) United States Patent
Han

(10) Patent No.: US 12,422,900 B2
(45) Date of Patent: Sep. 23, 2025

(54) ELECTRONIC DEVICE COMPRISING COAXIAL CABLE

(71) Applicant: Samsung Electronics Co., Ltd., Gyeonggi-do (KR)

(72) Inventor: Youngkyu Han, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 352 days.

(21) Appl. No.: 18/103,626

(22) Filed: Jan. 31, 2023

(65) Prior Publication Data
US 2023/0195182 A1 Jun. 22, 2023

Related U.S. Application Data

(63) Continuation of application No. PCT/KR2022/011110, filed on Jul. 28, 2022.

(30) Foreign Application Priority Data

Aug. 10, 2021 (KR) .................. 10-2021-0105028

(51) Int. Cl.
*G06F 1/16* (2006.01)
*H05K 1/14* (2006.01)

(52) U.S. Cl.
CPC .......... *G06F 1/1683* (2013.01); *G06F 1/1647* (2013.01); *G06F 1/1652* (2013.01); *G06F 1/1681* (2013.01); *H05K 1/147* (2013.01)

(58) Field of Classification Search
CPC .... G06F 1/1683; G06F 1/1647; G06F 1/1652; G06F 1/1681; G06F 1/165; G06F 1/1616;
(Continued)

(56) References Cited

U.S. PATENT DOCUMENTS 10,971,809 B2   4/2021   Shin et al.
11,510,328 B2   11/2022  Kim
(Continued)

FOREIGN PATENT DOCUMENTS

CN   111147630 A   5/2020
CN   211210044 U   8/2020
(Continued)

OTHER PUBLICATIONS

Korean Notice of Patent Grant dated Jun. 16, 2025.

*Primary Examiner* — Allen L Parker
*Assistant Examiner* — Keon Kim
(74) *Attorney, Agent, or Firm* — Cha & Reiter, LLC.

(57) ABSTRACT

According to certain embodiments, an electronic device may include: a housing including a first housing and a second housing; a hinge structure hingably connecting the first housing and the second housing, the hinge structure including at least one rotating arm; a bracket including a first area to cover a first rotating arm, a second area forming a step with the first area, and a stepped area formed between the first area and the second area, the stepped area having a first recess formed thereon; a battery disposed on the second area of the bracket; a first printed circuit board (PCB) which is disposed adjacent to a first periphery of the first housing; a second PCB disposed adjacent to a second periphery of the first housing and parallel to the first periphery; a flexible printed circuit board (FPCB) which is disposed between the battery and the second periphery, a second recess being formed on a part of the FPCB that is adjacent to the battery; and a radio frequency (RF) coaxial cable connected from a certain point of the first PCB to a certain point of the second PCB by passing through the first recess and the second recess.

20 Claims, 9 Drawing Sheets

(58) Field of Classification Search
CPC ...... G06F 1/1635; H05K 1/147; H05K 3/365; H05K 2201/10189; H04M 1/0262; H04M 1/0268; H04M 1/0274; H04M 1/0216; H04M 1/0277
See application file for complete search history.

(56) References Cited

U.S. PATENT DOCUMENTS

| | | | |
|---|---|---|---|
| 2015/0155614 A1* | 6/2015 | Youn | H04M 1/0202 |
| | | | 343/702 |
| 2018/0277934 A1* | 9/2018 | Kim | H01Q 1/38 |
| 2020/0119429 A1* | 4/2020 | Park | H01Q 1/38 |
| 2020/0267861 A1* | 8/2020 | Kim | G06F 1/1681 |
| 2021/0066800 A1* | 3/2021 | Suh | H03H 7/38 |
| 2021/0168227 A1 | 6/2021 | Jung et al. | |
| 2021/0185164 A1* | 6/2021 | Jung | H01Q 1/42 |
| 2022/0294099 A1 | 9/2022 | Choi et al. | |
| 2022/0321683 A1 | 10/2022 | Luo et al. | |

FOREIGN PATENT DOCUMENTS

| | | |
|---|---|---|
| JP | 2007-82032 A | 3/2007 |
| JP | 2012-205254 A | 10/2012 |
| KR | 10-2006-0027872 A | 3/2006 |
| KR | 10-2019-0101256 A | 8/2019 |
| KR | 10-2020-0046246 A | 5/2020 |
| KR | 10-2020-0101310 A | 8/2020 |
| KR | 10-2020-0101791 A | 8/2020 |
| KR | 10-2021-0067654 A | 6/2021 |
| KR | 10-2021-0068823 A | 6/2021 |

\* cited by examiner

ELECTRONIC DEVICE COMPRISING COAXIAL CABLE

CLAIM OF PRIORITY

This application is a continuation of International Application No. PCT/KR2022/011110, which was filed on Jul. 28, 2022, which claims priority to Korean Patent Application No. 10-2021-0105028 filed in the Korean Intellectual Property Office on Aug. 10, 2021, which is incorporated herein by reference in its entirety for all purposes.

BACKGROUND

1. Technical Field

Certain embodiments disclosed in the disclosure relate to an arrangement of a coaxial cable in an electronic device.

2. Background Art

A processor (for example, a communication processor (CP)) of an electronic device may determine a communication method to communicate with a base station. For example, a wireless communication circuit of an electronic device may communicate with a base station by using one or more of $3^{rd}$ generation (3G)/$4^{th}$ generation (4G) communication methods, or a $5^{th}$ generation (5G) communication method.

A wireless communication circuit (or a printed circuit board (PCB), mounting the same) may be electrically connected with respective antenna modules through a connector to control the respective antenna modules. For example, a first PCB and a second PCB may be electrically connected with each other by using a coaxial cable. The foregoing allows a wireless communication circuit disposed on the first PCB to transmit and receive wireless signals by using a radiator connected with the second PCB.

There is a growing tendency in user terminals such as smartphones toward a wide display screen with minimal, if not no bezel, slim devices, and having a long battery life. However, the above-mentioned factors may have a trade-off relationship. For example, when a display increases, a battery capacity should increase to allow a device to operate for a long time. However, the large battery capacity may increase thickness of the device. Accordingly, in order to avoid increasing the thickness of the device, the battery consume more space in the device. However, since inner components of the device, for example, a coaxial cable, reduces space for the battery. Accordingly, the size of the battery of the electronic device may be restricted.

In addition, when the number of electronic components mounted in the electronic device increases and the size of the battery increases, a size of a housing of the electronic device may increase. When the size of the housing of the electronic device increases, portability of the electronic device may be reduced.

Certain embodiments of the disclosure may overcome the above-described problems by providing an arrangement structure of a coaxial cable and an electronic device including the same.

SUMMARY

According to certain embodiments, an electronic device may include: a housing including a first housing and a second housing; a hinge structure hingably connecting the first housing and the second housing, the hinge structure including at least one rotating arm; a bracket including a first area to cover a first rotating arm, a second area forming a step with the first area, and a stepped area formed between the first area and the second area, the stepped area having a first recess formed thereon; a battery disposed on the second area of the bracket; a first printed circuit board (PCB) which is disposed adjacent to a first periphery of the first housing; a second PCB disposed adjacent to a second periphery of the first housing and parallel to the first periphery; a flexible printed circuit board (FPCB) which is disposed between the battery and the second periphery, a second recess being formed on a part of the FPCB that is adjacent to the battery; and a radio frequency (RF) coaxial cable connected from a certain point of the first PCB to a certain point of the second PCB by passing through the first recess and the second recess.

According to certain embodiments, an electronic device comprises: a housing comprising a first housing and a second housing; a hinge structure configured to connect the first housing and the second housing, the hinge structure comprising at least one rotating arm; a bracket comprising a first area to cover a first rotating arm of the at least one rotating arm, a second area forming a step with the first area, and a stepped area formed between the first area and the second area, the stepped area having a first recess formed thereon; a battery disposed on the second area of the bracket; a main display which is disposed over the first housing and the second housing to face in a first direction when the housing is unfolded; a sub display which is disposed on a surface opposite to the main display, the sub display being connected with an FPCB disposed inside the housing, a second recess being formed on a part of the FPCB; a main PCB which is disposed adjacent to an upper end periphery of the first housing; a wireless communication circuit disposed on the main PCB; a sub PCB which is disposed adjacent to a lower end periphery of the first housing; and an RF coaxial cable connecting the main PCB and the sub PCB, wherein the RF coaxial cable passes through the first recess and the second recess, wherein the wireless communication circuit is configured to feed to a conductive portion corresponding to at least part of the lower end periphery of the first housing by using the RF coaxial cable and the sub PCB, and to receive an RF communication signal of a designated frequency band.

BRIEF DESCRIPTION OF DRAWINGS

Regarding explanation of the drawings, the same or similar reference numerals may be used for the same or similar components.

DETAILED DESCRIPTION

According to certain embodiments of the disclosure, a space for mounting a battery of an electronic device may not be limited. For example, by guaranteeing a mounting space of a coaxial cable by using other electronic components, a mounting space of a battery may be guaranteed.

According to certain embodiments, by guaranteeing the mounting space of the coaxial cable, thickness of the electronic device may not increase. Though this, experience of a user using the electronic device may increase.

According to certain embodiments, the coaxial cable may be strongly fixed to an inside of the electronic device. Accordingly, the coaxial cable may smoothly deliver an electric signal to the inside of the electronic device without external interference or collision with other electronic components.

In addition, various effects that are directly or indirectly understood through the disclosure may be provided.

Certain embodiments of the disclosure will be described herein below with reference to the accompanying drawings. However, these are not intended to limit the disclosure to specific embodiments, and should be understood as including various modifications, equivalents, and/or alternatives of embodiments of the disclosure.

Figure 1:
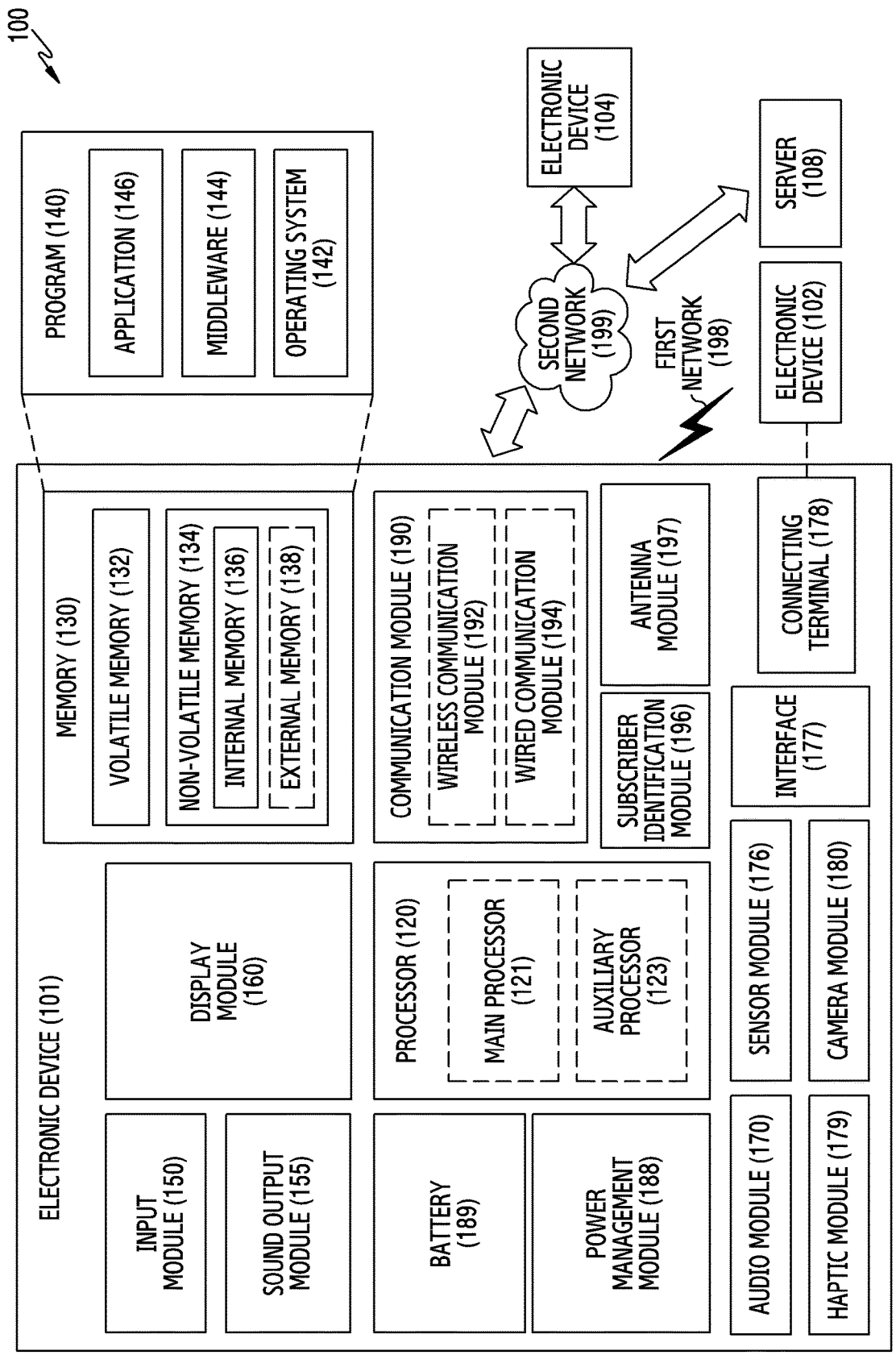
FIG. 1 is a view illustrating an electronic device in a network environment according to an embodiment.
Figure 2:
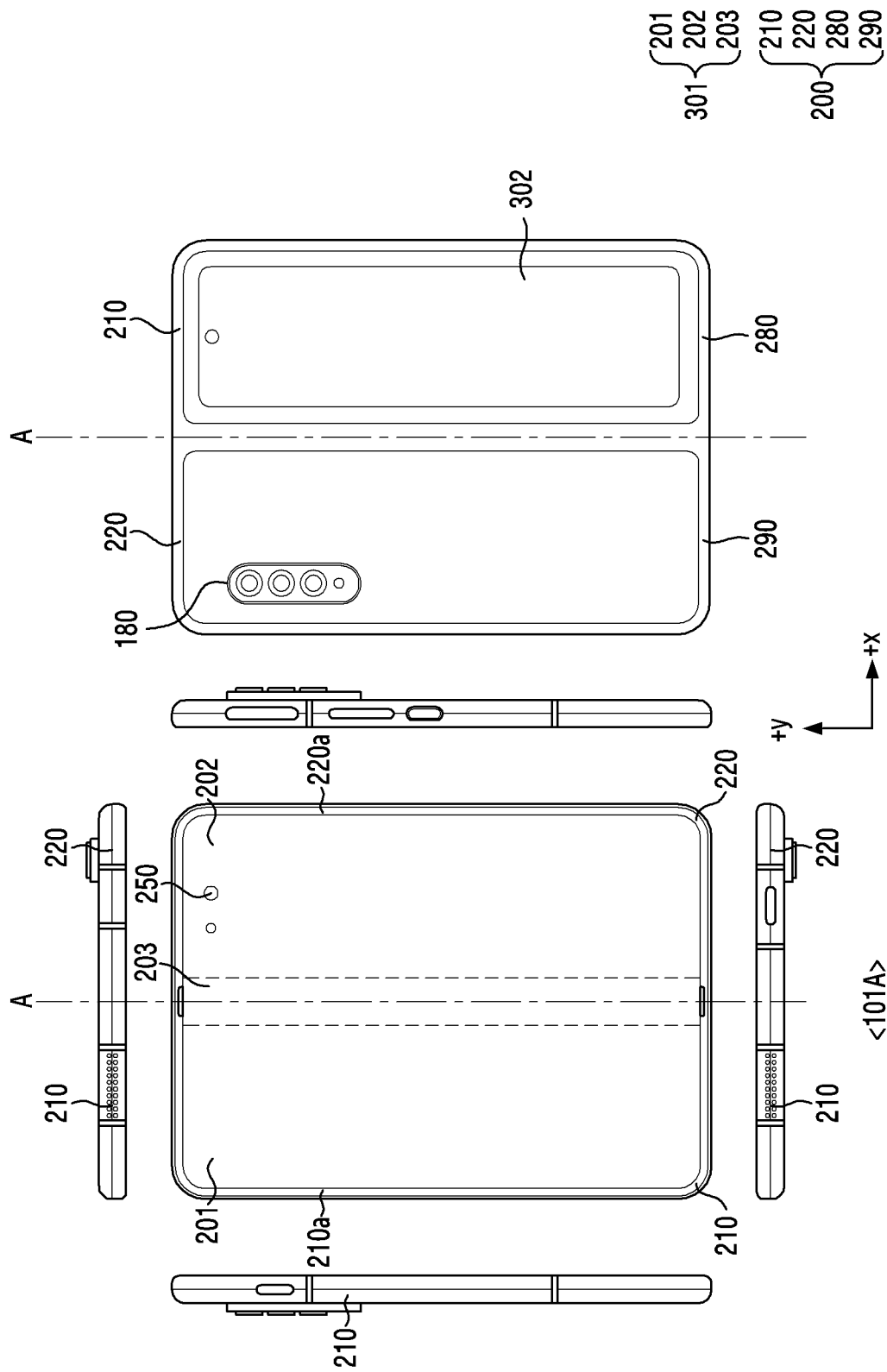
FIG. 2 is a view illustrating a flat state of an electronic device according to an embodiment.
Figure 3:
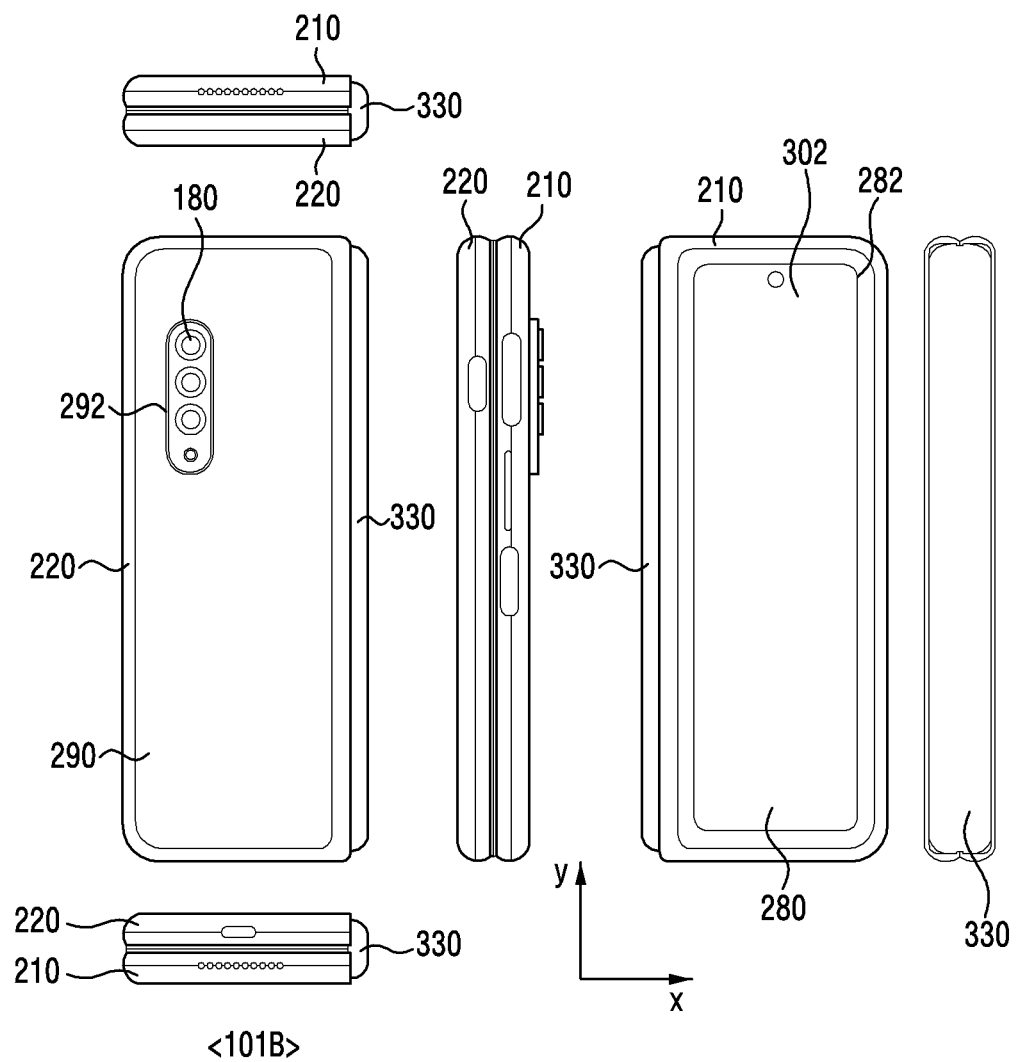
FIG. 3 is a view illustrating a folded state of the electronic device according to an embodiment.
Figure 4:
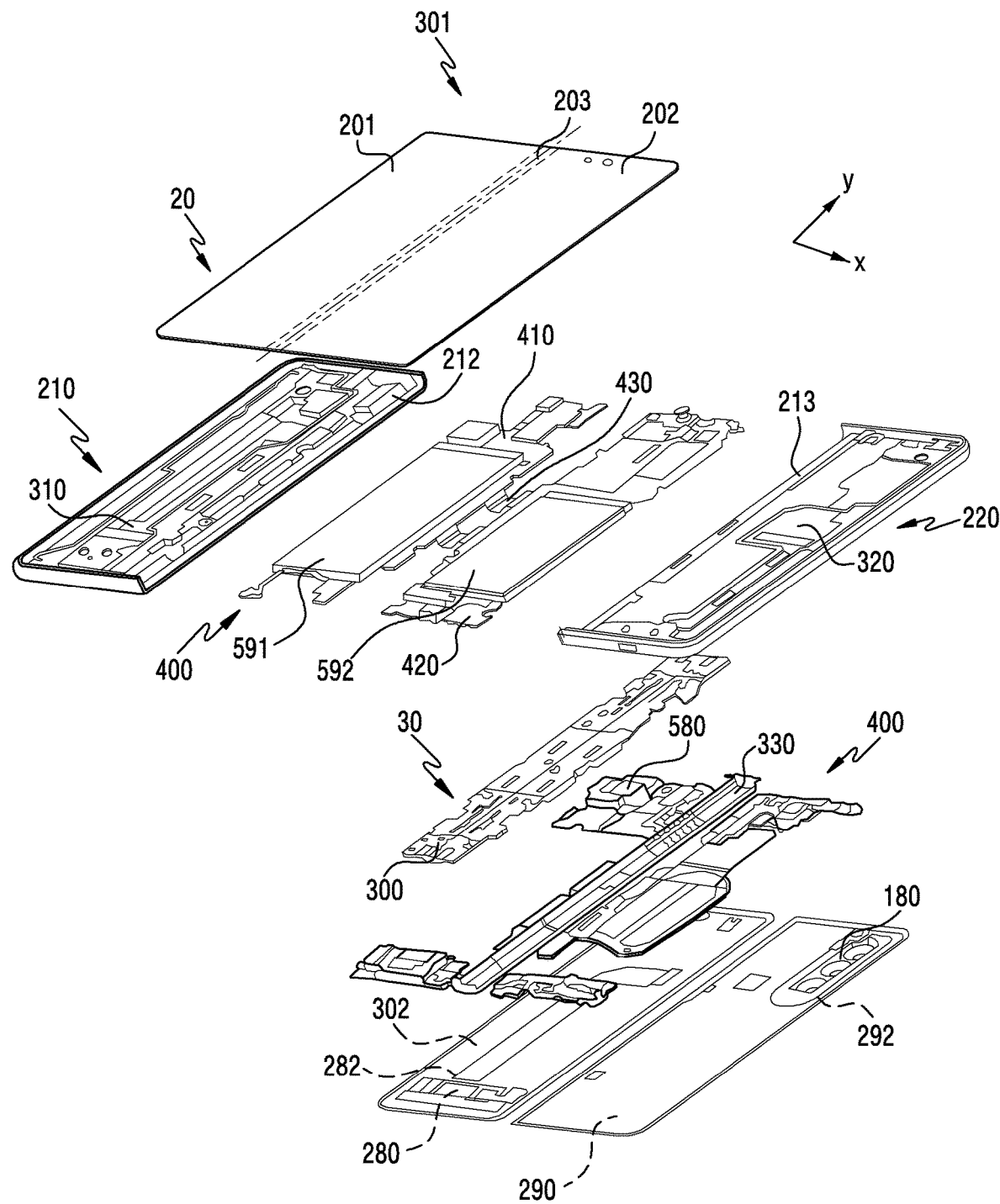
FIG. 4 is an exploded perspective view of the electronic device according to an embodiment.

FIGS. 1-4 describes an electronic device 101 wherein certain embodiments of the invention can be practiced. FIG. 1 describes functional modules of an electronic device in accordance with certain embodiments of the disclosure. FIGS. 2 and 3 describe a housing of an electronic device in accordance with certain embodiments of the disclosure. FIG. 4 describes the interior structures of an electronic device in accordance with certain embodiments of the disclosure. It will be observed that the interior space in an electronic device can be quite limited. However certain embodiment of this disclosure will provide an electronic device with a coaxial cable.

Electronic Device

1. Functional Modules of the Electronic Device

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The term "processor" shall be understood to refer both the singular and plural contexts.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

A common dilemma that occurs with electronic devices is portability versus display size. In order for the electronic device 101 to be portable, it has to have small dimensions. Generally, it is desirable for the electronic device 101 to fit into the user's pocket.

However, the smaller size restricts the size of the display module 160. This deteriorates the user experience as user's generally enjoy larger screens.

A foldable device allows the user to enjoy both the portability and the larger screens. With foldable electronic device, the user can fold the electronic device, thereby reducing one of the dimensions when moving about. However, the user can unfold the electronic device when they are using it, thereby improving the user experience.

FIGS. 2 and 3 show a housing of an electronic device that is foldable. Housing can be foldable with a flexible display disposed therein. The housing also houses various electronic components that implement the various modules shown in FIG. 1.

2. Housing of the Electronic Device

FIG. 2 is a view illustrating a flat state of an electronic device according to an embodiment. The flexible display 301 has a larger size when the electronic device is in the flat state, which improves the user experience. FIG. 3 is a view illustrating a folded state of the electronic device according to an embodiment. The width dimension is reduced by about half, thereby making the device more portable.

Referring to FIGS. 2 and 3, in an embodiment, the electronic device 101 may include a housing 200, a hinge cover 330 to cover a foldable portion of the housing 200, and a flexible or foldable display 301 (hereinafter, referred to as a "main display" 301) disposed in a space formed by the housing 200. In the disclosure, a surface on which the main display 301 is disposed is defined as a first surface or a front surface of the electronic device 101. In addition, the opposite surface of the front surface is defined as a second surface or a rear surface of the electronic device 101. In addition, a surface surrounding a space between the front surface and the rear surface is defined as a third surface or a side surface of the electronic device 101.

The housing 200 may include a foldable housing. In an embodiment, the housing 200 may include a first housing 210, a second housing 220, a first rear surface cover 280, and a second rear surface cover 290. The housing 200 of the electronic device 101 is not limited to the shape and coupling illustrated in FIGS. 2 and 3, and may be implemented by a combination and/or coupling of other shapes or components. For example, in another embodiment, the first housing 210 and the first rear surface cover 280 may be integrally formed with each other, and the second housing 220 and the second rear surface cover 290 may be integrally formed with each other.

In the illustrated embodiment, the first housing 210 and the second housing 220 may be disposed on both sides with reference to a folding axis (A axis), and may have a substantially symmetrical shape with respect to the folding axis A. As will be described below; the first housing 210 and the second housing 220 may have an angle or a distance therebetween that is changed according to whether the electronic device 101 is in a flat state, a folded state, or an intermediate state. According to an embodiment, the flat state of the electronic device 101 may refer to a open state 101A. In addition, the folded state of the electronic device 101 may refer to a closed state 101B.

In the illustrated embodiment, the second housing 220 may have a mutually symmetrical shape with the first housing 210. For example, the main display 301 may be symmetrically disposed over the first housing 210 and the second housing 220.

In an embodiment, at least part of the first housing 210 and the second housing 220 may be formed with a metallic material or a nonmetallic material having stiffness of a level selected to support the main display 301.

The first rear surface cover 280 may be disposed on one side of the folding axis on the rear surface of the electronic device, and for example, may have a substantially rectangular periphery and may have the periphery surrounded by the first housing 210. Similarly, the second rear surface cover 290 may be disposed on the other side of the folding axis on the rear surface of the electronic device, and may have the periphery surrounded by the second housing 220.

In the illustrated embodiment, the first rear surface cover 280 and the second rear surface cover 290 may have a substantially symmetrical shape with reference to the folding axis (A axis). However, the first rear surface cover 280 and the second rear surface cover 290 may not necessarily have the symmetrical shape, and in another embodiment, the electronic device 101 may include the first rear surface cover 280 and the second rear surface cover 290 of various shapes. In still another embodiment, the first rear surface cover 280 may be integrally formed with the first housing 210, and the second rear surface cover 290 may be integrally formed with the second housing 220.

In an embodiment, the first rear surface cover 280, the second rear surface cover 290, the first housing 210, and the second housing 220 may form a space to have various components (for example, a printed circuit board or a battery) of the electronic device 101 disposed therein. In an embodiment, one or more components may be disposed on the rear surface of the electronic device 101 or may be visually exposed. For example, at least part of a sub display 302 may be visually exposed through a first rear surface area 282 of the first rear surface cover 280. In another embodiment, the sub display 302 may be disposed on the entirety of the first rear surface area 282 of the first rear surface cover 280.

In another embodiment, one or more components or a sensor may be visually exposed through a second rear surface area 292 of the second rear surface cover 290. In certain embodiments, the sensor may include a proximity sensor and/or a rear-facing camera.

The main display 301 may be disposed on the space formed by the housing 200. For example, the main display 200 may be seated on a recess formed by the housing 200, and may form most of the front surface of the electronic device 101.

Accordingly, the front surface of the electronic device 101 may include the main display 301, and some areas of the first housing 210 adjacent to the main display 301 and some areas of the second housing 220. In addition, the rear surface of the electronic device 101 may include the first rear surface cover 280, some areas of the first housing 210 that are adjacent to the first rear surface cover 280, the second rear surface cover 290, and some areas of the second housing 220 that are adjacent to the second rear surface cover 290.

The main display 301 may refer to a display that has at least some areas deformable to a flat surface or a curved surface. In an embodiment, the main display 301 may include a folding area 203, a first area 201 disposed on one side (the left of the folding area 203 show in FIG. 2) with reference to the folding area 203, and a second area 202 disposed on the other side (the right of the folding area 203 shown in FIG. 2).

The divided areas of the main display 301 shown in FIG. 2 are examples and the main display 301 may be divided into a plurality of areas (for example, four or more areas or two areas) according to a structure or a function of the main display 301. For example, in the embodiment illustrated in 2, the main display 301 may be divided into areas by the folding area 203 extended in parallel with the y-axis or the folding axis (A axis), but in another embodiment, the main display 301 may be divided into areas with reference to another folding area (for example, a folding area parallel to the x-axis) or another folding axis (for example, a folding axis parallel to the x-axis).

The first area 201 and the second area 202 may have a substantially symmetrical shape with reference to the folding area 203. However, the second area 202 may include a camera hole 250, differently from the first area 201, but may have a symmetrical shape with the first area 201 on the other area. In other words, the first area 201 and the second area 202 may include portions that have a symmetrical shape and portions that have an asymmetrical shape.

The camera hole 250 may be visually exposed to the outside of the electronic device 101. According to another embodiment, the camera hole 250 may be disposed on a lower portion of the main display 301 not to be visually exposed.

Hereinafter, operations of the first housing 210 and the second housing 220 and respective areas of the main display 301 according to a state (for example, a flat state 101A and a folded state 101B) of the electronic device 101 will be described.

When the electronic device 101 is in the flat state 101A (for example, FIG. 2), the first housing 210 and the second housing 220 may form the angle of 180° and may be disposed to face in the same direction. A surface of the first area 201 of the main display 301 and a surface of the second area 202 may form the angle of 180° with each other, and may face in the same direction (for example, the front surface direction of the electronic device). The folding area 203 may form the same plane as the first area 201 and the second area 202.

When the electronic device 101 is in the folded state 101B (for example, FIG. 3), the first housing 210 and the second housing 220 may be disposed to face each other. The surface of the first area 201 of the main display 301 and the surface of the second area 202 may face each other while forming a small angle (for example, between 0°) and) 10° with each other. At least part of the folding area 203 may have a curved surface having a predetermined curvature.

When the electronic device 101 is in the intermediate state, the first housing 210 and the second housing 220 may be disposed with a certain angle. The surface of the first area 201 of the main display 301 and the surface of the second area 202 may form an angle that is larger than in the folded state and is smaller than in the flat state. At least part of the folding area 203 may have a curved surface having a predetermined curvature, and the curvature in this state may be smaller than in the folded state.

Interior Structures in the Housing

FIG. 4 is an exploded perspective view of an electronic device according to an embodiment.

Referring to FIG. 4, in an embodiment, the electronic device 101 may include a display unit 20, a bracket assembly 30, a board unit 400, a first housing 210, a second housing 220, a first rear surface cover 280, and a second rear surface cover 290. In the disclosure, the display unit 20 may be referred to as a display module or a display assembly.

The display unit 20 may include a main display 301 and one or more plates or layers (not shown) on which the main display 301 is seated. In an embodiment, the plate may be disposed between the main display 301 and the bracket assembly 30. The main display 301 may be disposed on at least part of one surface (for example, an upper surface in FIG. 4) of the plate. The plate may be formed in a shape corresponding to the main display 301.

The bracket assembly 30 may include a first bracket 310, a second bracket 320, a hinge structure 300 disposed between the first bracket 310 and the second bracket 320, a hinge cover 330 to cover the hinge structure 300 when it is viewed from the outside, and a wire member 430 (for example, a flexible printed circuit (FPC)) crossing over the first bracket 310 and the second bracket 320.

Referring to FIG. 4, the hinge cover 330 may be disposed between the first housing 210 and the second housing 220, and may be configured to hide inner components (for example, the hinge structure 300). In an embodiment, the hinge cover 330 may be hidden by a part of the first housing 210 and the second housing 220, or may be exposed to the outside, according to a state (a flat state 101A or a folded state 101B) of the electronic device 101.

For example, when the electronic device 101 is in the flat state 101A as shown in FIG. 2, the hinge cover 330 may be hidden by the first housing 210 and the second housing 220 and may not be exposed. For example, when the electronic device 101 is in the folded state 101B (for example, a fully folded state) as shown in FIG. 3, the hinge cover 330 may be exposed to the outside between the first housing 210 and the second housing 220. For example, in an intermediate state in which the first housing 210 and the second housing 220 are folded with a certain angle, the hinge cover 330 may be exposed to the outside in part between the first housing 210 and the second housing 220. However, in this case, the exposed area may be smaller than in the fully folded state. In an embodiment, the hinge cover 330 may include a curved surface.

In an embodiment, the bracket assembly 30 may be disposed between the plate and the board unit 400. For example, the first bracket 310 may be disposed between the first area 201 of the main display 301 and a first board 410.

The second bracket 320 may be disposed between the second area 202 of the main display 301 and a second board 420.

In an embodiment, the wire member 430 and at least part of the hinge structure 300 may be disposed inside the bracket assembly 30. The wire member 430 may be disposed in a direction (for example, an x-axis direction) of crossing over the first bracket 310 and the second bracket 320. The wire member 430 may be disposed in a direction (for example, the x-axis direction) perpendicular to a folding axis (for example, the y-axis or the folding axis A of FIG. 2) of the folding area 203 of the electronic device 101.

As mentioned above, the board unit 400 may include the first board 410 disposed on the side of the first bracket 310, and the second board 420 disposed on the side of the second bracket 320. The first board 410 and the second board 420 may be disposed in a space formed by the bracket assembly 30, the first housing 210, the second housing 220, the first rear surface cover 280, and the second rear surface cover 290. Components for implementing various functions of the electronic device 101 may be mounted on the first board 410 and the second board 420.

According to an embodiment, the first board 410 may be formed of a plurality of boards. According to an embodiment, the first board 410 may have the plurality of boards which are separated. For example, the first board 410 may include a first printed circuit board 510 and a second printed circuit board 520 which are separated. The first housing 210 and the second housing 220 may be assembled with each other to be coupled to both sides of the bracket assembly 30 with the display unit 20 being coupled to the bracket assembly 30. As will be described below; the first housing 210 and the second housing 220 may slide from both sides of the bracket assembly 30 and may be coupled with the bracket assembly 30.

In an embodiment, the first housing 210 may include a first rotation support surface 212, and the second housing 220 may include a second rotation support surface 213 corresponding to the first rotation support surface 212. The first rotation support surface 212 and the second rotation support surface 213 may include curved surfaces corresponding to curved surfaces included in the hinge cover 230.

In an embodiment, when the electronic device 101 is in the flat state (for example, the electronic device of FIG. 2), the first rotation support surface 212 and the second rotation support surface 213 may cover the hinge cover 330, such that the hinge cover 330 is not exposed to the rear surface of the electronic device 101 or is exposed to the minimum. On the other hand, when the electronic device 10 is in the folded state 101B (for example, the electronic device of FIG. 3), the first rotation support surface 212 and the second rotation support surface 213 may rotate along the curved surface included in the hinge cover 330, such that the hinge cover 330 is exposed to the rear surface of the electronic device 101 to the maximum.

According to an embodiment, the electronic device 101 may further include a battery (189 of FIG. 1) and a speaker module 580.

According to an embodiment, the battery 189 may include a first battery 591 and a second battery 592.

According to an embodiment, the first battery 591 and the second battery 592 may be mounted inside the housing 200 of the electronic device 101 and may not be exposed to the outside. For example, the first battery 591 may be mounted inside the first housing 210. In addition, the second battery 592 may be mounted inside the second housing 220.

According to an embodiment, the first battery 591 and the second battery 592 may be electrically connected with each other by the wire member 430 (for example, a flexible printed circuit board) disposed between the first housing 210 and the second housing 220.

According to an embodiment, the speaker module 580 may refer to the above-described sound output module 155. According to an embodiment, the speaker module 580 may be disposed inside the first housing 210. For example, the speaker module 580 may be disposed on a certain area adjacent to the first battery 591 inside the first housing 210. According to an embodiment, the speaker module 580 may not be exposed to the outside of the electronic device 101.

Figure 5:
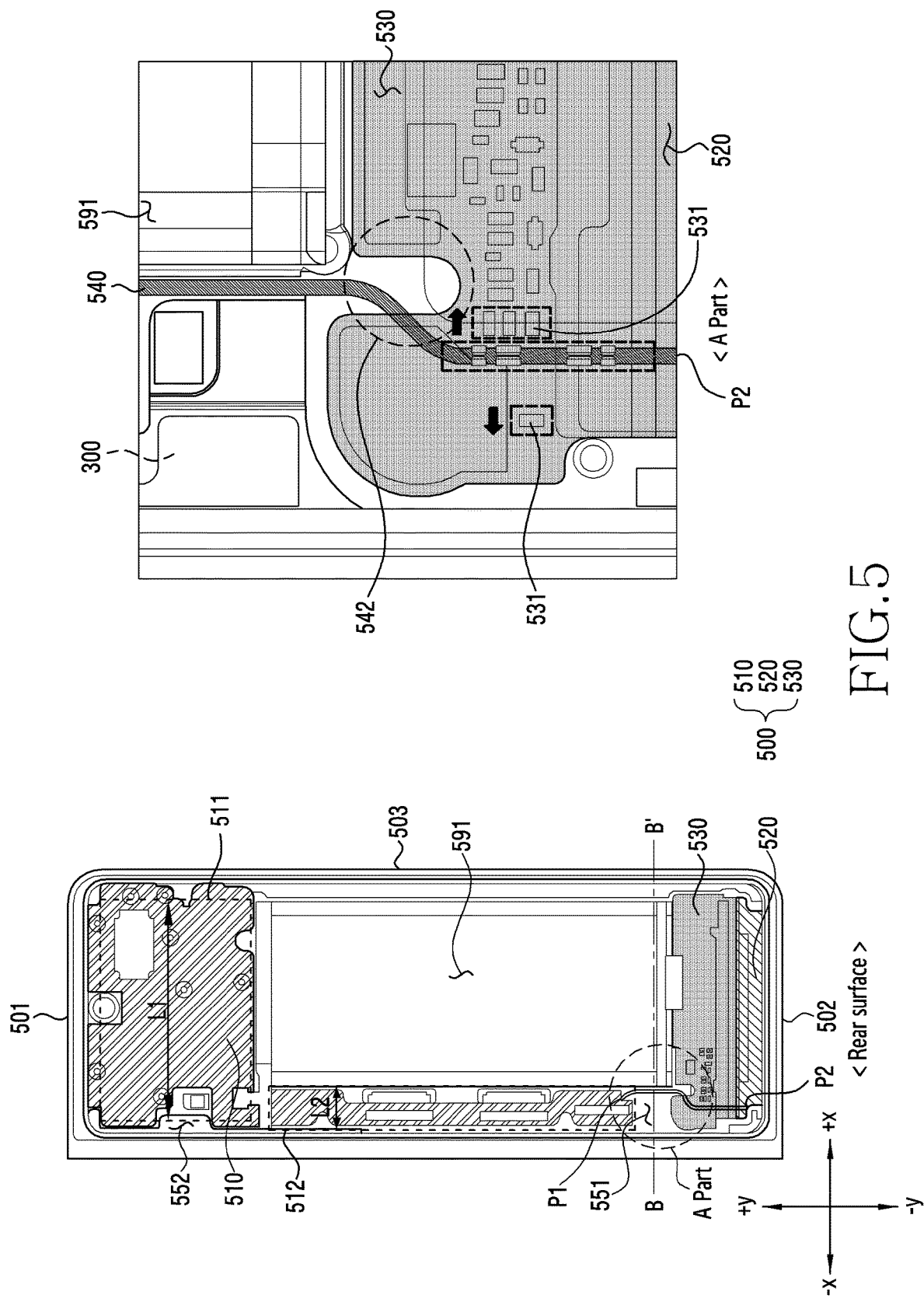
FIG. 5 is a cross-sectional view illustrating an arrangement relationship of electronic components of an electronic device according to an embodiment.

With the growing trend for electronic devices with a wide display screen with minimal, if not no bezel, slim devices, and having a long battery life. However, long battery life may require a large battery 591. The entire space between the rear surface cover 290 and a large portion of the front surface may be consumed by the battery 591 and the various other structures. FIG. 5 will disclose an embodiment of an electronic device 101 that includes a coaxial cable, battery, and other structures.

FIG. 5 is a cross-sectional view illustrating an arrangement relationship of electronic components and a coaxial cable in an electronic device according to an embodiment. According to an embodiment, FIG. 5 illustrates an interior of a rear surface of a first housing (210 of FIG. 1) of the electronic device 101. For example, FIG. 5 illustrates an interior of a rear surface cover (280 of FIG. 1) of the electronic device 101.

The RF coaxial cable 540 may be disposed in an area of the bracket 310 that covers the hinge structure 300.

The electronic device 101 may include a housing (for example, 200 of FIG. 2), a hinge structure 300, a first bracket 310 (hereinafter, a "bracket 310"), printed circuit boards (PCBs) 510, 520, 530, and a radio frequency (RF) coaxial cable 540.

According to an embodiment, explanation of the first board 410 of FIG. 4 may be applied to the PCBs 510, 520, 530.

The electronic device 101 may further include a first battery 591, a main display (for example, 301 of FIG. 2), a sub display (for example, 302 of FIG. 2), and a wireless communication circuit (not shown).

The housing 200 may form an exterior of the electronic device 101. The first battery 591, the PCBs 510, 520, 530, and the RF coaxial cable 540 may be disposed inside a space formed by the housing 200.

The housing 200 may include a first housing 210 and a second housing 220. The first housing 210 and the second housing 220 may be distinguished from each other. For example, the first battery 591 may be disposed in the first housing 210 and a camera module 180 may be disposed in the second housing 220. In another example, the first battery 591 may be disposed in the first housing 210, and a second battery 592 having a different capacity from that of the first battery 591 may be disposed in the second housing 220. Components disposed in the first housing 210 and the second housing 220 are not limited to those described above, and various components may be arranged in various combinations.

The first housing 210 may include a first periphery 501, a second periphery 502, and a third periphery 503. For example, the first periphery 501 may correspond to an upper end periphery of the electronic device 101. In addition, the second periphery 502 may correspond to a lower end periphery of the electronic device 101. The third periphery 503 may connect the first periphery 501 and the second periphery 502, and may be formed on a side surface of the electronic device 101.

The housing 200 of the electronic device 101 may be folded or unfolded by the hinge structure 300. According to an embodiment, an unfolding state of the first housing 210 and the second housing 220 may refer to the open state 101A. In addition, according to an embodiment, a folding state of the first housing 210 and the second housing 220 of the electronic device 101 may refer to the closed state 101B.

According to an embodiment, at least part of the housing 200 may be formed with a conductive member (for example, a metal member). For example, at least part of the first periphery 501 of the first housing 210 may be formed with a conductive member. According to another embodiment, at least part of the second periphery 502 may be formed with a conductive member. According to still another embodiment, at least part of the third periphery 503 may be formed with a conductive member. A portion of the peripheries of the housing 200 that is formed with a conductive member may operate as an antenna radiator of the electronic device 101.

However, the material of the housing 200 is not limited thereto. For example, at least part of the second periphery 502 may be formed with or comprise a conductive material, and the other part may be formed with or comprise a nonconductive member (for example, a polymer member).

The electronic device 101 may include at least one display. For example, the electronic device 101 may include the main display (for example, 301 of FIG. 2) and the sub display (for example, 302 of FIG. 2).

The main display 301 face in a first direction (for example, a +z direction) in the open state 101A in which the housing 200 is unfolded. The main display 301 may be disposed over the first housing 210 and the second housing 220 to face in the first direction (for example, the +z direction) in the open state 101A.

The sub display 302 may be disposed on the opposite surface of the main display 301. For example, the sub display 302 may be disposed on the opposite surface of the surface of the first housing 210 on which the main display 301 is disposed in the open state 101A. The sub display 302 may be disposed on the first rear surface cover 280 of the first housing 210.

When the electronic device is in the closes state, the main display 101 is not visible to the user. Accordingly, the user can use the sub display 302.

The main display 301 may be formed with a first size. The sub display 302 may be formed with a second size smaller than the first size. However, the size of the sub display 302 is not limited thereto. For example, the sub display 302 may be formed with the same size as the main display 301.

The hinge structure 300 may hingably connect the first housing 210 and the second housing 220. For example, the hinge structure 300 may hingably connect the first housing 210 and the second housing 220 to allow the second housing 220 to rotate with respect to the first housing 210. The second housing 220 may be rotated about a first axis (for example, a y-axis) with respect to the first housing 210 by the hinge structure 300. The first axis can coincide with the hinge. The first axis (for example, the y-axis) may be defined as an axis formed in the longitudinal direction (the longer dimension) of the electronic device 101.

The hinge structure 300 may include at least one arm sliding structure. For example, the hinge structure 300 may include a first rotating arm 551 and a second rotating arm 552. The second rotating arm 552 may be formed adjacent to the first periphery 501 of the housing 200. For example, the second rotating arm 552 may be formed adjacent to an upper end of the housing 200.

The first rotating arm 551 and the second rotating arm 552 rotating about the rotating axis. Since the first rotating arm 551 and the second rotating arm 552 are embedded in either the first or second housing structure, thereby allowing the first or second housing structure to rotate about the rotating axis.

In addition, the first rotating arm 551 may be formed adjacent to the second periphery 502 which is parallel to the first periphery 501. For example, the first rotating arm 551 may be formed adjacent to a lower end of the housing 200 (the upper end of the housing can refer to the end that include the telephone speaker for a phone call while the lower end of the housing can refer to the end that includes the telephone microphone).

The first rotating arm 551 and the second rotating arm 552 may operate all together, thereby allowing the electronic device 101 to be folded or unfolded.

The bracket 310 may be formed inside the electronic device 101. For example, the bracket 310 may be disposed on a certain area of the first housing 210 that is adjacent to the hinge structure 300.

The bracket 310 may cover at least part of the hinge structure 300. According to another embodiment, the bracket 310 may be extended from a certain area of the first housing 210 that is adjacent to the hinge structure 300 to an area where the first battery 591 is mounted or the third periphery 503.

The bracket 310 may be integrally formed with the hinge cover 330 of FIG. 3. According to another embodiment, the bracket 310 may be formed separately from the hinge cover 330.

The bracket 310 may include a first area 311, a second area 312 (see FIG. 6) having a designated step from the first area 311, and a stepped area 313 formed between the first area 311 and the second area 312. A part of the stepped area 313 may have the same height as the first area 311 and the other part of the stepped area 313 may have the same height as the second area 312.

The first area 311 of the bracket 310 may cover the hinge structure 300. The first battery 591 may be disposed on the second area 312 which is distinguished from the first area 311 of the bracket 310. The RF coaxial cable 540 may be disposed on the stepped area 313 between the first area 311 and the second area 312 of the bracket 310.

Specific embodiments related to the bracket 310 and a first recess 541 will be described below with reference to FIG. 6.

The electronic device 101 may include a plurality of PCBs. For example, the electronic device 101 may include a first PCB 510, a second PCB 520, and a flexible PCB 530.

The first PCB 510 may be disposed to be adjacent to a periphery of the first housing 210. For example, the first PCB 510 may be disposed adjacent to an upper end periphery of the electronic device 101. For example, the first PCB 510 may be disposed adjacent to the first periphery 501 of the electronic device 101.

The first PCB 510 may include a first area 511 and a second area 512. The first area 511 of the first PCB 510 may be formed adjacent to the second rotating arm 552. In addition, the first area 511 of the first PCB 510 may be formed adjacent to the first periphery 501.

The second area 512 of the first PCB 510 may be extended from the first area 511. For example, the second area 512 may be extended from a part of the first area 511 in a direction toward the second periphery 502 (for example, a −y direction). For example, the second area 512 of the first PCB 510 may be extended from the first area 511 to an area that is adjacent to the first rotating arm 551.

The first area 511 of the first PCB 510 may be formed with a first width L1. In addition, the second area 512 of the first PCB 510 may be formed with a second width L2. The first width L1 of the first area 511 may be larger than the second width L2 of the second area 512. The second area 512 may have the second width L2 smaller than the first width L1, such that the second area 512 may be disposed inside the electronic device 101 along with the first battery 591 with reference to one axis (for example, an x axis).

The first PCB 510 may be formed in an inversed L shape. However, the shape of the first PCB 510 is not limited thereto. For example, the first PCB 510 may be formed in a T-shaped form.

The second area 512 of the first PCB 510 may be extended to the first rotating arm 551, such that a length of the RF coaxial cable 540 may be reduced. In addition, by reducing the length of the RF coaxial cable 540, a path loss of an RF signal which uses a lower end antenna of the electronic device 101 may be minimized and power efficiency may increase.

The first PCB 510 may refer to a main PCB.

The second PCB 520 may be disposed on an area opposite to the first PCB 510. The second PCB 520 may be disposed adjacent to a periphery of the first housing 210. For example, the second PCB 520 may be disposed on an area that is adjacent to the second periphery 502 of the first housing 210, opposite to the first PCB 510. For example, the second PCB 520 may be disposed on an area that is adjacent to a lower end periphery of the first housing 210, opposite to the first PCB 510.

The second PCB 520 may be disposed on an area adjacent to the second periphery 502, such that the second PCB 520 may feed to a conductive portion of the second periphery 502. Through this, the second PCB 520 may receive an RF communication signal of a designated frequency band.

The second PCB 520 may refer to a sub PCB.

In an embodiment, the electronic device 101 may include the flexible PCB (FPCB) 530 electrically connected with the display. The FPCB 530 may be disposed between the second periphery 502 of the housing 200 and the first battery 591. According to another embodiment, the FPCB 530 may overlap the second PCB 520 in part with reference to the z-axis. According to still another embodiment, the FPCB 530 may be disposed between the first battery 591 and the second periphery 502.

However, positions of the first PCB 510, the second PCB 520, and the FPCB 530 are not limited thereto. For example, at least part of the FPCB 530 may be disposed between the first PCB 510 and the second PCB 520.

The FPCB 530 may be electrically connected with the sub display 302. For example, referring to FIG. 6, the FPCB 530 may be extended from one end of the sub display 302 which faces in the first direction (for example, a −z direction) and may be bent inward the electronic device 101, and may be disposed to overlap some areas of the sub display 302 on the first axis (for example, the z-axis).

Referring to the <A portion> of FIG. 5 The FPCB 530 may include a second recess 542. For example, the second recess 542 may be formed on a part of the FPCB 530. According to another embodiment, the second recess 542 may be formed on a part of a periphery of the FPCB 530. According to still another embodiment, the second recess 542 may be formed on a periphery of the FPCB 530 that is adjacent to the first battery 591.

A specific embodiment related to the second recess 542 will be described in detail with reference to FIG. 6.

The FPCB 530 may include at least one electronic component 531. The at least one electronic component 531 may be spaced apart from the RF coaxial cable 540 and may be disposed on the FPCB 530. According to another embodiment, the at least one electronic component 530 may be disposed without overlapping with reference to the first direction (for example, the +z direction or the −z direction) which is perpendicular to the rear surface of the electronic device 101. Through the above-described arrangement, interference between signals passing through the at least one electronic component 531 disposed on the FPCB 530, and the RF coaxial cable 540 may be minimized.

The at least one electronic component 531 may be spaced apart from the RF coaxial cable 540, such that a space for disposing the RF coaxial cable 540 may be guaranteed.

The RF coaxial cable 540 may be disposed inside the electronic device 101. According to an embodiment, one end of the RF coaxial cable 540 may be connected with the first PCB 510. The other end of the RF coaxial cable 540 may be connected with the second PCB 520. In another example, one end of the RF coaxial cable 540 may be connected with a main PCB and the other end may be connected with a sub PCB.

Figure 6:
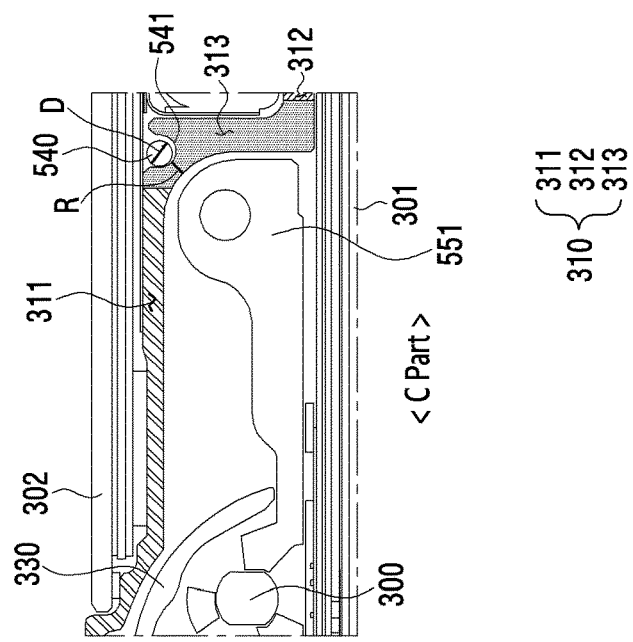
FIG. 6 is a view illustrating a cross-section of the electronic device, taken on line B-B', according to an embodiment.
Figure 6:
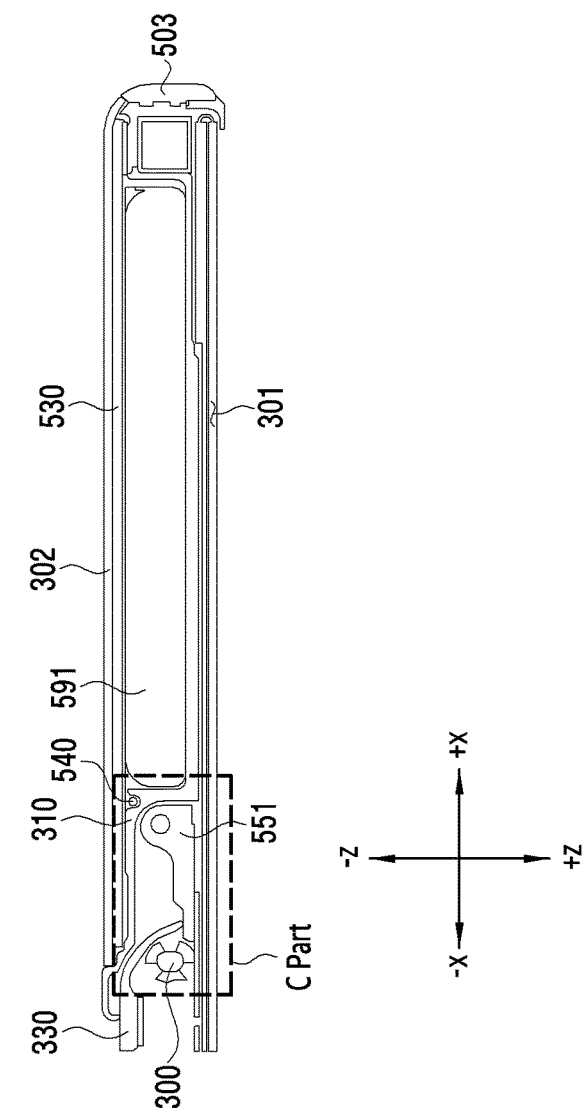

According to an embodiment, a part of the RF coaxial cable 540 may be disposed in the first recess 541 illustrated in the <C portion> of FIG. 6. Another part of the RF coaxial cable 540 may pass through the second recess 542. For example, the RF coaxial cable 540 may be connected from a certain point of the first PCB 510 to a certain point of the second PCB 520 by passing through the first recess 541. The RF coaxial cable 540 may be connected from a certain point of the first PCB 510 to a certain point of the second PCB 520 by passing through the second recess 542.

The RF coaxial cable 540 may be connected from a first point P1 of the first PCB 510 to a second point P2 of the second PCB 520 by passing through the first recess 541 and the second recess 542. In another embodiment, the RF coaxial cable 540 may be connected from the first point P1 of the main PCB to the second point P2 of the sub PCB by passing through the first recess 541 and the second recess 542.

The RF coaxial cable 540 may be disposed to pass through the first recess 541 and the second recess 542, such that a thickness of the electronic device including the RF coaxial cable 540 on the first axis (for example, the z-axis) may not increase. In addition, since the RF coaxial cable 540 does not invade the second area of the bracket where the battery is mounted with respect to the second axis (for example, the x-axis) of the electronic device 101, a mounting space of the battery may be guaranteed to the maximum.

According to an embodiment, by connecting the RF coaxial cable 540 to a certain point of the second PCB 520, the electronic device 101 may use a part of the second periphery 502 of the first housing 210 as a radiator. According to an embodiment, when a part of the second periphery 502 of the first housing 210 is used as a radiator, the electronic device 101 may guarantee more enhanced antenna performance than when both ends of the first periphery 501 of the electronic device 101 are used as a radiator.

The electronic device 101 may transmit and receive RF signals by using the second periphery 502 of the first housing 210 as a radiator. According to an embodiment, a wireless communication circuit (not shown) may be disposed on the first PCB 510. The wireless communication circuit disposed on the first PCB 510 may feed to a conductive portion of at least part of the housing 200. For example, the wireless communication circuit may feed to a conductive portion of at least part of the second periphery 502 of the housing 200. The wireless communication circuit may receive an RF communication signal of a designated frequency band by using a conductive portion.

The wireless communication circuit may feed to a conductive portion of at least part of the second periphery 502 of the housing 200 by using an electronic component of the electronic device 101. For example, the wireless communication circuit may feed to a conductive portion of at least part of the second periphery 502 of the housing 200 by using the RF coaxial cable 540. The wireless communication circuit may feed to a conductive portion of at least part of the second periphery 502 of the housing 200 by using the second PCB 520. According to another embodiment, the wireless communication circuit may feed to a conductive portion of at least part of the second periphery 502 of the housing 200 by using the RF coaxial cable 540 and the second PCB 520. For example, the wireless communication circuit may feed to a conductive portion of at least part of the second periphery 502 of the first housing by using the RF coaxial cable 540 and the second PCB 520. The wireless communication circuit may receive an RF communication signal of a designated frequency band by feeding to a conductive portion.

The wireless communication circuit may feed to a conductive portion of at least part of the first periphery 501 of the housing 200 through the first PCB 510.

The wireless communication circuit may transmit and/or receive a signal of a designated frequency band, by feeding to a conductive portion of at least part of the first periphery 501 of the housing 200.

FIG. 6 is a view illustrating a cross section of the electronic device 101, taken on line B-B' of FIG. 5 according to an embodiment. The bracket 310 covers the first rotating arm 551 and includes a first area 311, a second area 312, and a stepped area 313. The bracket 310 includes a first recess 541. The RF coaxial cable 540 can be disposed in the first recess 541. The stepped area 313 can abut the side of the battery 591.

According to an embodiment, FIG. 6 is a view illustrating the cross section of the electronic device 101, taken on line B-B' of FIG. 5, and an enlarged cross section of the <C portion> of FIG. 6

Referring to the <C portion> of FIG. 6, the RF coaxial cable 540 may be mounted in the first recess 541 according to an embodiment.

The bracket 310 may include the first area 311, the second area 312 having the designated step from the first area 311, and the stepped area 313 formed between the first area 311 and the second area 312.

The first recess 541 may be formed on a certain area between the hinge cover 330 and/or the hinge structure 300, and the first battery 591. According to another embodiment, the first recess 541 may be formed on the bracket 310 which covers the hinge structure 300.

The first area 311 may cover the first rotating arm 551. The first area 311 of the bracket 310 may be formed adjacent to the sub display 302. The first rotating arm 551 covered by the first area 311 may be formed adjacent to the main display 301. For example, the first area 311 may be formed over the first rotating arm 551 with reference to the first direction (for example, the −z direction). The first area 311 may cover the first rotating arm 551 with reference to the first axis (for example, the z-axis) which is perpendicular to the first rear surface cover 280 of the electronic device 101.

The second area 312 may be extended from the third area 313 toward a side surface of the electronic device 101 or the third periphery 503. For example, the second area 312 may be formed in a shape larger than the first area 311. The first battery 591 may be disposed on the second area 312.

The stepped area 313 may be formed between the first area 311 and the second area 312. For example, the first area 311 may be connected with the second area 312 while forming a step. The first area 311 may be extended toward the front surface of the electronic device 101 or the main display 301 while forming a step. For example, the third area 313 may be extended from one end of the first area 311 toward the main display 301 and may be connected with one end of the second area 312.

According to an embodiment, at least part of the stepped area 313 between the first area 311 and the second area 312 may be inclined.

The first recess 541 may be formed on the stepped area 313. The first recess 541 may be formed on a periphery of the stepped area. For example, the first recess 541 may be formed on a periphery of the stepped area 313 that is adjacent to the sub display 302. According to another embodiment, the first recess 541 may be formed on one end of the stepped area 313 with reference to the first direction (for example, the −z direction). According to an embodiment, a part of the first recess 541 may be recessed in a second direction (for example, the +z direction) which is opposite to the first direction (for example, the −z direction).

The first recess 541 may be used as a space for disposing the RF coaxial cable 540. For example, the RF coaxial cable 540 may be mounted in the first recess 541.

The RF coaxial cable 540 is mounted on the first recess 541, such that a mounting space for other electronic components (for example, the first battery 591) may be guaranteed in the electronic device 101. In addition, since the mounting space is guaranteed, the thickness of the electronic device 101 with reference to the first axis (for example, the z-axis) may not increase. For example, the RF coaxial cable 540 is mounted on the first recess 541, such that the thickness of the electronic device 101 may not increase by the thickness of the RF coaxial cable 540.

The RF coaxial cable 540 may have a diameter D of 0.63 mm to 0.67 mm. The first recess 541 may have a diameter D within a range from 0.63 mm to 0.67 mm to correspond to the RF coaxial cable 540. The first recess 541 may be formed with the diameter D of the above-described range, such that the RF coaxial cable 540 is seated within the first recess 541 and does not protrude above the first recess 541. The first recess 541 may be formed with the diameter D of the above-described range, such that the RF coaxial cable 540 may be mounted on the first recess 541.

The RF coaxial cable 540 may be connected with the second PCB (for example, 520 of FIG. 5) by passing through the first recess 541 of the bracket 310.

The RF coaxial cable 540 may be connected to the second PCB 520 by passing through the first recess 541, such that the RF coaxial cable 540 may deliver a signal and/or power provided from the first PCB (for example, 510 of FIG. 5) to the second PCB 520. In addition, a signal and/or information acquired in the second PCB 520 may be delivered to the first PCB 510 through the RF coaxial cable 540.

The RF coaxial cable 540 may be connected to the second PCB 520 formed adjacent to the second periphery 502, such that the electronic device 101 may use at least part of the second periphery 502 of the first housing 210 as a radiator.

According to an embodiment, at least part of the second periphery 502 of the first housing 210 may be used as a radiator, such that the electronic device 101 may receive an RF communication signal of a designated frequency band.

According to an embodiment, when an RF communication signal is received by using the first periphery 501 and the second periphery 502, the electronic device 101 may use an antenna of performance that is more enhanced than when the electronic device 101 receives an RF communication signal by using only the first periphery 501 as a radiator.

The first recess 541 through which the RF coaxial cable 540 passes may be spaced apart from the first rotating arm 551 by a distance R which is within a range from 0.30 mm to 0.50 mm. The RF coaxial cable 540 is spaced apart from the first rotating arm 551, such that interference by the RF coaxial cable 540 is prevented in a folding or unfolding process of the electronic device.

Figure 7:
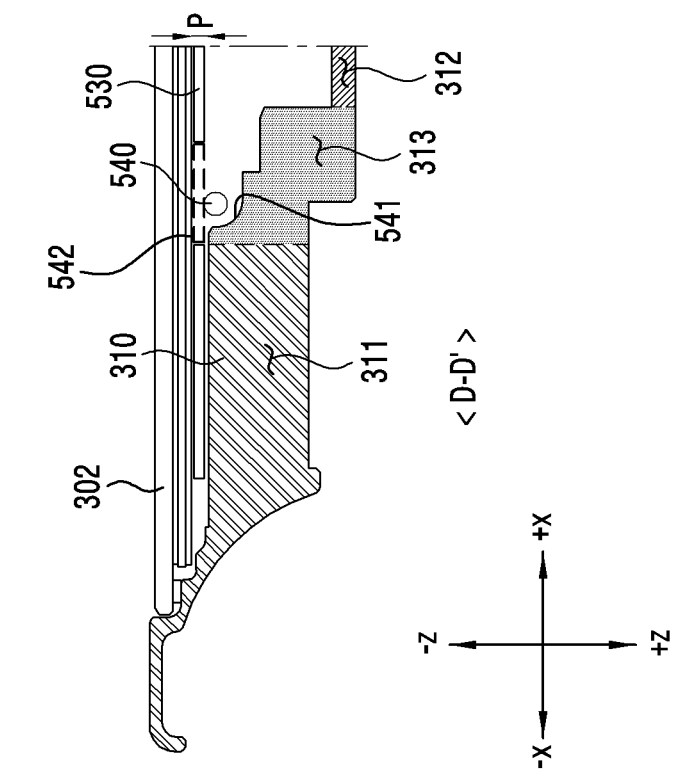
FIG. 7 is a view illustrating a cross section of the electronic device in a folded state according to an embodiment.
Figure 7:
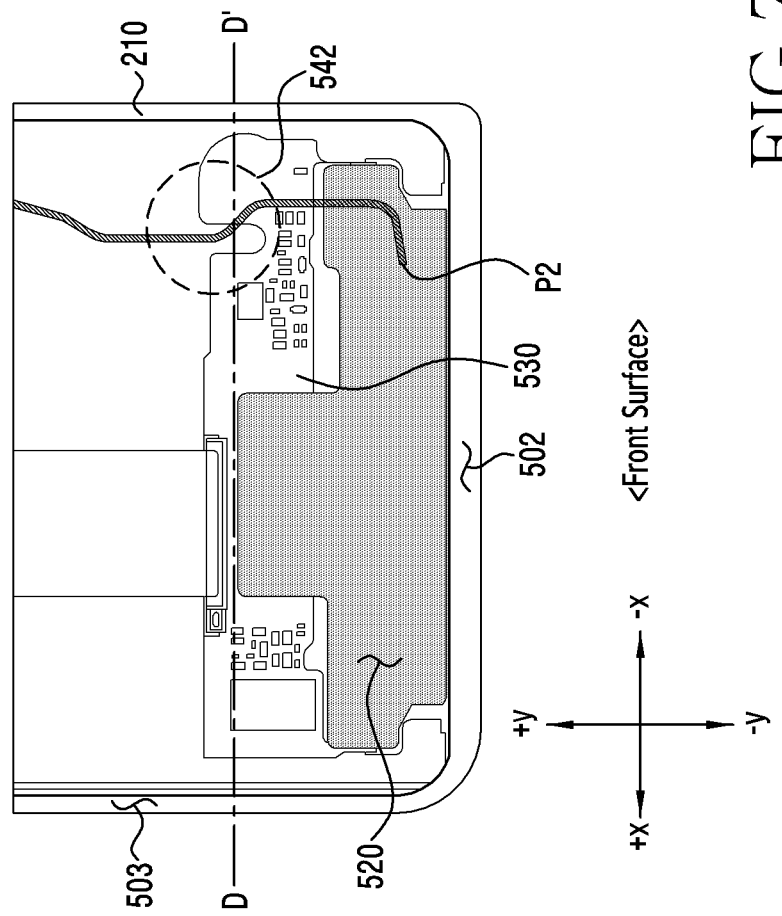

FIG. 7 is a view illustrating a cross section of the electronic device in a folded state according to an embodiment. According to an embodiment, FIG. 7 illustrates the opposite surface of FIG. 5. For example, FIG. 5 illustrates the interior of the rear surface of the housing 210 of the electronic device 101, and FIG. 7 illustrates an interior of the front surface of the housing 210 of the electronic device 101.

The bracket 310 includes a stepped area 313. The stepped area 313 a first recess 541. The first recess 541 can accommodate the RF coaxial cable 540.

According to an embodiment, FIG. 7 is a view illustrating the first area (for example, 311 of FIG. 6) of the bracket 310 of the front surface of the electronic device 101 in the closed state 101B, in which the electronic device 101 is folded, and a cross section taken on line D-D'.

The electronic device 101 may include the FPCB 530 and the second PCB 520 which is distinguished from the FPCB 530.

The second recess 542 may be formed on the FPCB 530.

The second recess 542 of the FPCB 530 may be formed toward the second PCB 520 on a certain plane (for example, an xy plane). For example, the second recess 542 may be recessed in a second direction (for example, −y direction) which is perpendicular to the first direction (for example, the −z direction) on the certain plane (for example, xy plane). According to another embodiment, a part of the second recess 542 may be recessed in the second direction which is parallel to the third periphery 503 of the electronic device 101 on the certain plane (for example, xy plane).

However, the direction in which the second recess 542 is formed is not limited thereto. For example, the second recess 542 may be formed in a direction corresponding to a path of the RF coaxial cable 540.

According to an embodiment, referring to FIG. 7, the second recess 542 may be formed in a U-shaped form. However, the shape of the second recess 542 is not limited thereto. For example, the second recess 542 may be formed in a rectangle-shaped form.

The RF coaxial cable 540 may pass through the second recess 542. For example, the RF coaxial cable 540 may be connected from a certain point of the first PCB 510 to the second PCB 520 by passing through the second recess 542. According to another embodiment, the RF coaxial cable 540 may be connected from a certain point of the first PCB 510 to the second PCB 520 by passing through the first recess 541 and the second recess 542.

The second recess 542 may be formed, such that the electronic device 101 may minimize mechanical interference by the FPCB 530 on the RF coaxial cable 540.

The RF coaxial cable 540 may pass through the second recess 542, such that interference between the RF coaxial table 540 and the FPCB 530 may be minimized. For example, a phenomenon in which the FPCB 530 and the RF coaxial cable 540 overlap each other and a part of the RF coaxial cable 540 is pressed or bent may be reduced/removed.

The second recess 542 may be formed with a constant thickness on the first axis (for example, a z axis). For example, the second recess 542 may be formed with a constant thickness P of 0.32 mm to 0.36 mm with reference to a third direction (for example, a +z direction) which is opposite to the first direction (for example, the −z direction) of the electronic device 101, but the thickness of the second recess 542 is not limited thereto.

The second recess 542 may be formed with a constant thickness within a range from 0.32 mm to 0.36 mm, such that a space through which the RF coaxial cable 540 passes may be guaranteed. The second recess 542 may be formed with the thickness P, such that the RF coaxial cable 540 may pass through the second recess 542 without colliding with the sub display 302 and/or an electronic component mounted between the FPCB 530 and the sub display 302.

Figure 8:
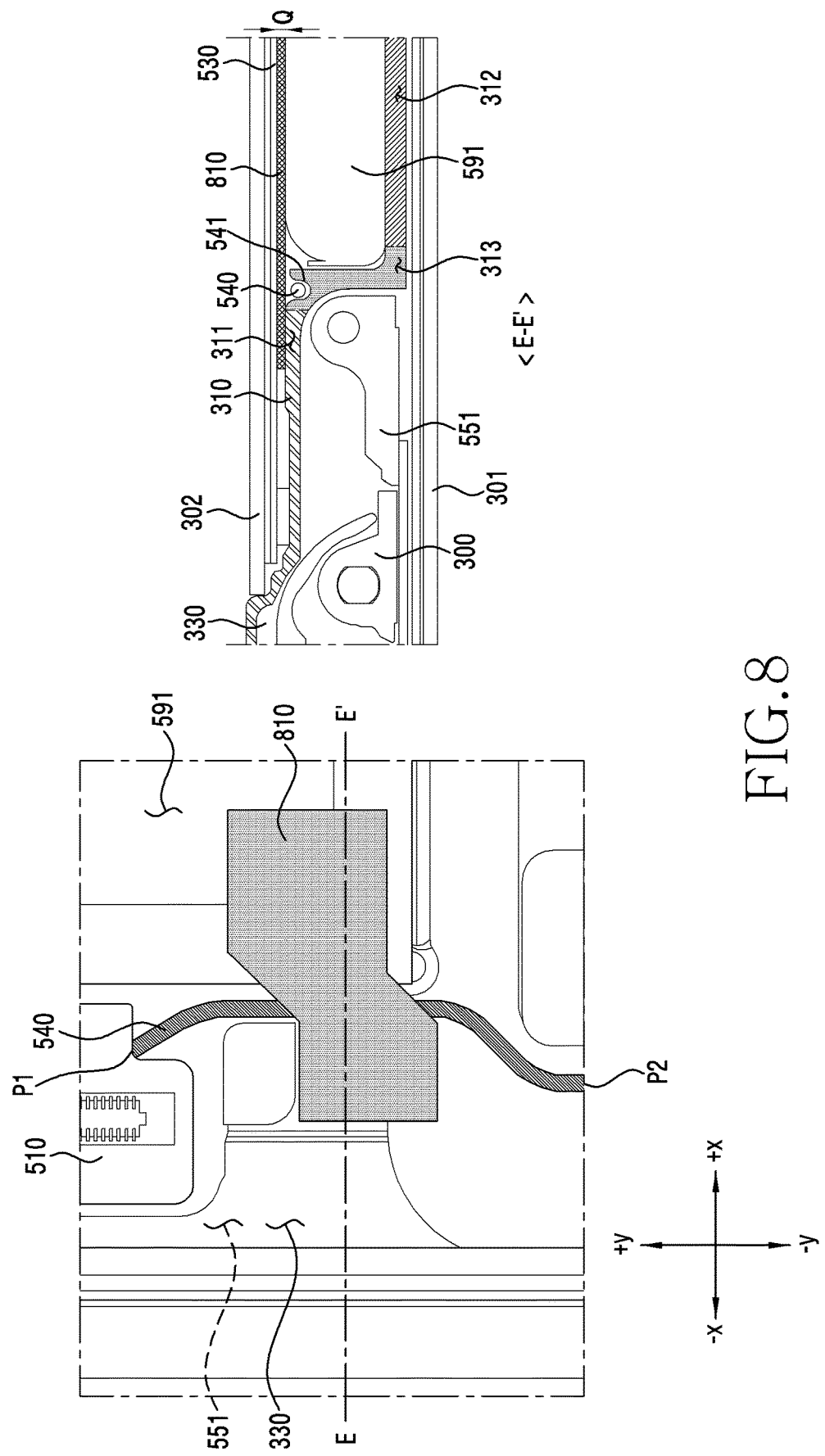
FIG. 8 is a cross-sectional view illustrating a coaxial cable which is mounted in a first recess of the electronic device, and a thin film tape according to an embodiment.

FIG. 8 is a cross-sectional view illustrating the RF coaxial cable 540 which is mounted on the first recess 541 of the electronic device 101, and a thin film tape 810.

The bracket 310 includes a first area 311, a stepped area 313, and a second area 312. The first area 311 goes over the first rotating arm 551. The stepped area 313 is disposed laterally from the first rotating arm 551 and abuts the side of the battery 591. The RF coaxial cable is disposed in a first recess 541 in the stepped area 313.

The electronic device 101 may further include an adhesive member to fix an electronic component within the electronic device 101. For example, the electronic device 101 may further include the thin film tape 810.

The thin film tape 810 may serve to fix some components of the electronic device 101. For example, the thin film tape 810 may serve to fix the RF coaxial cable 540 of the electronic device 101.

The thin film tape 810 may be attached to at least some areas of the bracket 310 and the first battery 591. For example, the thin film tape 810 may be attached to the first recess 541 which is formed on a stepped area 332 of the bracket 310. According to another embodiment, the thin film tape 810 may be attached from a part of the first area 311 of the bracket 310 to a part of the first battery 591.

According to an embodiment, by attaching the thin film tape 810, the RF coaxial cable 540 may be fixed to the bracket 310. For example, the RF coaxial cable 540 may be fixed onto the first recess 541 of the bracket 310 by the thin film tape 810.

According to an embodiment, by attaching the thin film tape 810, collision between the RF coaxial cable 540 and neighboring electronic components may be prevented. For example, the thin film tape 810 may prevent collision between the RF coaxial cable 520 and a certain area of the FPCB 530. According to another embodiment, the thin film tape 810 may prevent collision between the RF coaxial cable 540 and the first battery 591.

According to an embodiment, by preventing collision between the RF coaxial cable 540 and an electronic component and/or the FPCB 530, the RF coaxial cable 540 may deliver an electric signal to the second PCB 520 without interference.

Referring to the cross section taken on line E-E' of FIG. 8, The thin film tape 810 may be disposed between the sub display 301 and/or the FPCB 530 and the bracket 310 and/or the first battery 591 with reference to the first axis (for example, the z-axis).

The thin film tape 810 may be formed with a thickness Q having a value within a range from 0.02 mm to 0.04 mm, but is not limited thereto.

The thickness Q of the thin film tape 810 may have a value within the range from 0.02 mm to 0.04 mm, such that the RF coaxial cable 540 may be fixed without substantially increasing the thickness of the electronic device 101.

Figure 9:
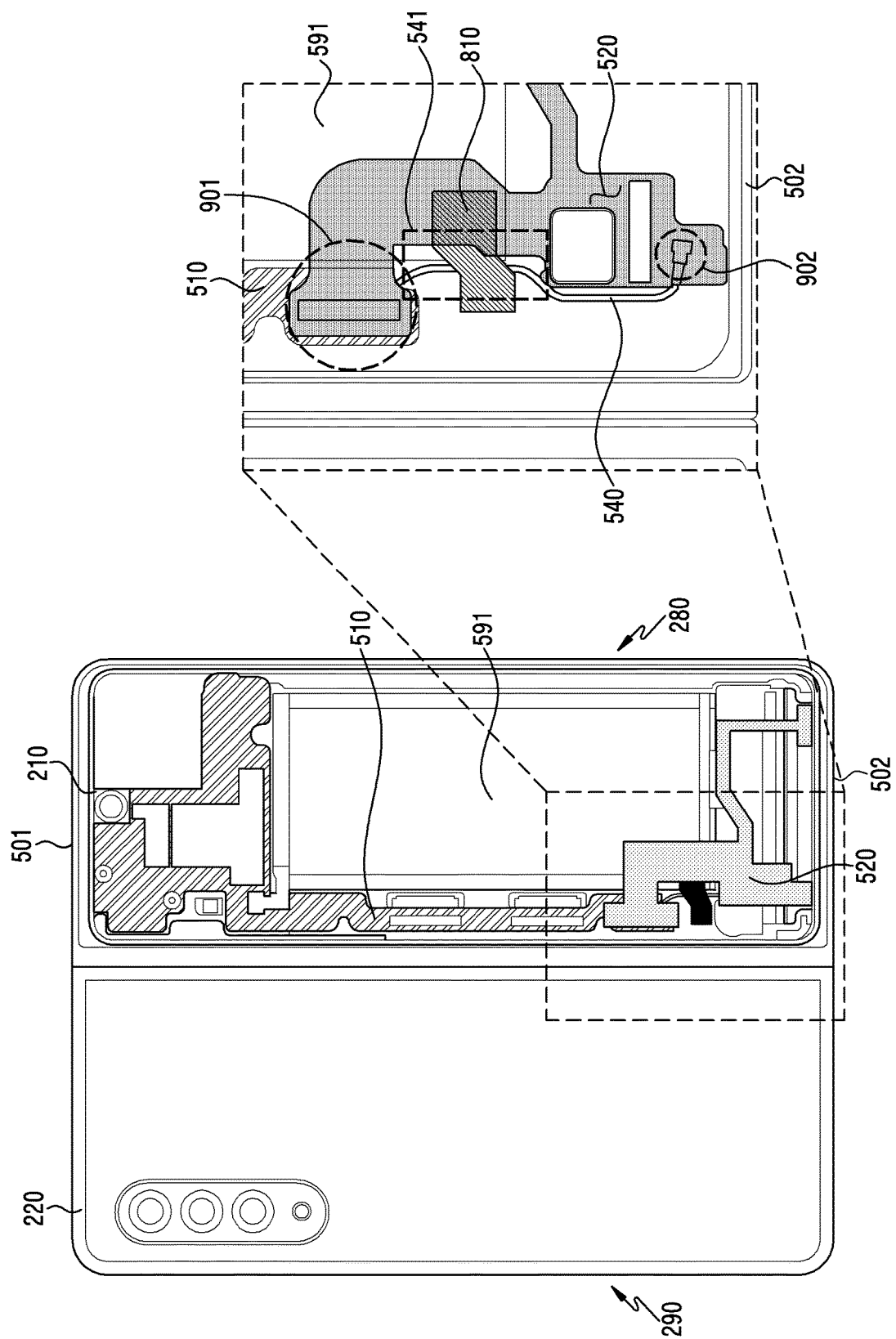
FIG. 9 is a cross-sectional view illustrating a state in which the RF coaxial cable of the electronic device is connected to a second PCB according to an embodiment.

FIG. 9 is a cross-sectional view illustrating a state in which the RF coaxial cable 540 of the electronic device 101 is connected to the second PCB 520.

The RF coaxial cable 540 may be connected with the first PCB 510 and the second PCB 520. For example, one end of the RF coaxial cable 540 may be connected to a first point 901 of the first PCB 510. In addition, the other end of the RF coaxial cable 540 may be connected to a second point 902 of the second PCB 520.

The RF coaxial cable 540 may be connected to the second PCB 520 by passing through the first recess 541, the second recess 542.

In addition, the thin film tape 810 may be disposed on a path of the RF coaxial cable 540. For example, the thin film tape 810 may be disposed on the first recess 541. The thin film tape 810 may be bonded to the bracket and/or other inner components while covering a part of the RF coaxial cable 540 on the first recess 541 on which the RF coaxial cable 540 is disposed, such that the RF coaxial cable 540 may be fixed to the first recess 541.

The second PCB 520 may include an antenna circuit board (not shown).

The RF coaxial cable 540 may be connected from the first PCB 510 to the second PCB 520, such that the electronic device 101 may transmit and receive an RF signal of a designated frequency band by using a conductive member adjacent to the second PCB 520. For example, a wireless communication circuit of the first PCB 510 may transmit and receive an RF signal by feeding to a conductive member of the second periphery 502 of the first housing 210 by using the RF coaxial cable 540 and the second PCB 520.

According to another embodiment, the wireless communication circuit may deliver an electric signal to the second PCB 520 by using the RF coaxial cable 540. The second PCB 520 which receives the signal may feed to a conductive member of the second periphery 502 of the first housing 210. The second PCB 520 may feed to the conductive member of the second periphery 502 of the first housing 210, such that the electronic device 101 may transmit and receive an RF signal of a designated frequency band.

According to certain embodiments, an electronic device may include: a housing including a first housing and a second housing; a hinge structure hingably connecting the first housing and the second housing, the hinge structure including at least one rotating arm; a bracket including a first area to cover a first rotating arm, a second area forming a step with the first area, and a stepped area formed between the first area and the second area, the stepped area having a first recess formed thereon; a battery disposed on the second area of the bracket; a first printed circuit board (PCB) which is disposed adjacent to a first periphery of the first housing; a second PCB disposed adjacent to a second periphery of the first housing and parallel to the first periphery; a flexible printed circuit board (FPCB) which is disposed between the battery and the second periphery, a second recess being formed on a part of the FPCB that is adjacent to the battery; and a radio frequency (RF) coaxial cable connected from a certain point of the first PCB to a certain point of the second PCB by passing through the first recess and the second recess.

According to an embodiment, the electronic device further comprises a thin film tape fixing the RF coaxial cable onto the first recess of the bracket wherein the thin film tape is attached to at least part of the bracket and the battery.

According to an embodiment, the thin film tape has a thickness from 0.02 mm to 0.04 mm.

According to an embodiment, the second recess of the FPCB may be formed toward the second PCB, and the second recess may be formed in a U-shaped form.

According to an embodiment, the second recess has a thickness between 0.32 mm to 0.36 mm in a direction orthogonal to a rear surface of the electronic device.

According to an embodiment, the RF coaxial cable has a thickness between 0.63 mm to 0.67 mm.

According to an embodiment, the FPCB may include at least one electronic component, and the at least one electronic component may be spaced apart from the RF coaxial cable and may be disposed on the FPCB and non-overlapping in a direction orthogonal to a rear surface of the electronic device.

According to an embodiment, the electronic device may further include: a flexible display disposed on the first housing and the second housing; and a sub display disposed on a surface of the first housing that is opposite to the flexible display.

According to an embodiment, the FPCB may be connected with a sub display.

According to an embodiment, the second PCB may feed to a conductive portion corresponding to at least part of the second periphery of the first housing.

According to an embodiment, the first PCB may include a wireless communication circuit.

According to an embodiment, the at least one rotating arm of the hinge structure may include the first rotating arm which is adjacent to the second periphery of the housing, and a second rotating arm which is adjacent to the first periphery of the housing, and the first PCB may be extended from a certain area adjacent to the second rotating arm to the first rotating arm.

According to an embodiment, the first PCB may include a first area which is adjacent to the second rotating arm, and a second area which is extended from the first area to the first rotating arm, and the first area may have a width of a first size, and the second area has a width of a second size which is smaller than the first size.

According to an embodiment, the first recess may be spaced apart from the first rotating arm by a distance between 0.30 mm to 0.50 mm.

According to an embodiment, the housing comprises a conductive member.

According to certain embodiments, an electronic device may include: a housing including a first housing and a second housing; a hinge structure configured to connect the first housing and the second housing, the hinge structure including at least one rotating arm; a bracket including a first area to cover a first rotating arm of the at least one rotating arm, a second area forming a step with the first area, and a stepped area formed between the first area and the second area, the stepped area having a first recess formed thereon; a battery disposed on the second area of the bracket; a main display which is disposed over the first housing and the second housing to face in a first direction when the housing is unfolded; a sub display which is disposed on a surface opposite to the main display, the sub display being connected with an FPCB disposed inside the housing, a second recess being formed on a part of the FPCB; a main PCB which is disposed adjacent to an upper end periphery of the first housing; a wireless communication circuit disposed on the main PCB; a sub PCB which is disposed adjacent to a lower end periphery of the first housing; and an RF coaxial cable connecting the main PCB and the sub PCB, and the RF coaxial cable connecting passes through the first recess and the second recess, the wireless communication circuit may feed to a conductive portion corresponding to at least part of the lower end periphery of the first housing by using the RF coaxial cable and the sub PCB, and may receive an RF communication signal of a designated frequency band.

According to an embodiment, further comprising thin film tape attached to the first recess of the bracket fixing the RF coaxial cable onto the first recess.

According to an embodiment, a thickness of the thin film tape is between 0.02 mm to 0.04 mm.

According to an embodiment, the second recess may be formed toward the lower end periphery of the first housing, and the second recess may be formed in a U-shaped form.

According to an embodiment, the main display may be a flexible display.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, The module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

I claim:

1. An electronic device comprising:
   a housing comprising a first housing and a second housing;
   a hinge structure hingably connecting the first housing and the second housing, the hinge structure comprising at least one rotating arm;
   a bracket comprising a first area to cover a first rotating arm of the at least one rotating arm, a second area forming a step with the first area, and a stepped area formed between the first area and the second area, the stepped area having a first recess formed thereon;
   a battery disposed on the second area of the bracket;
   a first printed circuit board (PCB) which is disposed adjacent to a first periphery of the first housing;
   a second PCB disposed adjacent to a second periphery of the first housing and parallel to the first periphery;
   a flexible printed circuit board (FPCB) disposed between the battery and the second periphery, a second recess formed on a part of the FPCB that is adjacent to the battery; and
   a radio frequency (RF) coaxial cable connected from a certain point of the first PCB to a certain point of the second PCB by passing through the first recess on the bracket and the second recess of the FPCB.

2. The electronic device of claim 1, further comprising a thin film tape fixing the RF coaxial cable onto the first recess of the bracket, wherein the thin film tape is attached to at least part of the bracket and the battery.

3. The electronic device of claim 2, wherein the thin film tape has a thickness between 0.02 mm to 0.04 mm.

4. The electronic device of claim 1, wherein the second recess of the FPCB is formed toward the second PCB, and wherein the second recess is formed in a U-shaped form.

5. The electronic device of claim 4, wherein the second recess has a thickness between 0.32 mm to 0.36 mm in a direction orthogonal to a rear surface of the electronic device.

6. The electronic device of claim 1, wherein the RF coaxial cable has a thickness between 0.63 mm to 0.67 mm.

7. The electronic device of claim 1, wherein the FPCB comprises at least one electronic component, and
   wherein the at least one electronic component is spaced apart from the RF coaxial cable and is disposed on the FPCB and non-overlapping in a direction orthogonal to a rear surface of the electronic device.

8. The electronic device of claim 1, further comprising:
   a flexible display disposed on the first housing and the second housing; and
   a sub display disposed on a surface of the first housing that is opposite to the flexible display.

9. The electronic device of claim 1, wherein the FPCB is connected with a sub display.

10. The electronic device of claim 1, wherein the second PCB feeds to a conductive portion corresponding to at least part of the second periphery of the first housing.

11. The electronic device of claim 1, wherein the first PCB comprises a wireless communication circuit.

12. The electronic device of claim 1, wherein the at least one rotating arm of the hinge structure comprises the first rotating arm adjacent to the second periphery of the housing, and a second rotating arm adjacent to the first periphery of the housing, and
    wherein the first PCB is extended from a certain area adjacent to the second rotating arm to the first rotating arm.

13. The electronic device of claim 12, wherein the first PCB comprises a first area which is adjacent to the second rotating arm, and a second area which is extended from the first area to the first rotating arm, and
    wherein the first area has a width of a first size, and the second area has a width of a second size which is smaller than the first size.

14. The electronic device of claim 1, wherein the first recess is spaced apart from the first rotating arm by a distance between 0.30 mm to 0.50 mm.

15. The electronic device of claim 1, wherein the housing comprises a conductive member.

16. An electronic device comprising:
a housing comprising a first housing and a second housing;
a hinge structure configured to connect the first housing and the second housing, the hinge structure comprising at least one rotating arm;
a bracket comprising a first area to cover a first rotating arm of the at least one rotating arm, a second area forming a step with the first area, and a stepped area formed between the first area and the second area, the stepped area having a first recess formed thereon;
a battery disposed on the second area of the bracket;
a main display which is disposed over the first housing and the second housing to face in a first direction when the housing is unfolded;
a sub display which is disposed on a surface opposite to the main display, the sub display being connected with an FPCB disposed inside the housing, a second recess being formed on a part of the FPCB;
a main PCB which is disposed adjacent to an upper end periphery of the first housing;
a wireless communication circuit disposed on the main PCB;
a sub PCB which is disposed adjacent to a lower end periphery of the first housing; and
an RF coaxial cable connecting the main PCB and the sub PCB,
wherein the RF coaxial cable passes through the first recess and the second recess,
wherein the wireless communication circuit is configured to feed to a conductive portion corresponding to at least part of the lower end periphery of the first housing by using the RF coaxial cable and the sub PCB, and to receive an RF communication signal of a designated frequency band.

17. The electronic device of claim 16, further comprising thin film tape attached to the first recess of the bracket fixing the RF coaxial cable onto the first recess.

18. The electronic device of claim 17, wherein a thickness of the thin film tape is between 0.02 mm to 0.04 mm.

19. The electronic device of claim 16, wherein the second recess is formed toward the lower end periphery of the first housing, and
wherein the second recess is formed in a U-shaped form.

20. The electronic device of claim 16, wherein the main display is a flexible display.

* * * * *